United States Patent
Nygaard, Jr.

(10) Patent No.: US 6,578,058 B1
(45) Date of Patent: Jun. 10, 2003

(54) SYSTEM AND METHOD FOR COMPARING VALUES FROM TARGET SYSTEMS

(75) Inventor: Richard A Nygaard, Jr., Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/413,731

(22) Filed: Oct. 6, 1999

(51) Int. Cl.[7] .............................. G06F 7/02; G06F 7/04
(52) U.S. Cl. .................................... 708/200; 340/146.2
(58) Field of Search ...................... 708/200; 340/146.2; 326/39

(56) References Cited

U.S. PATENT DOCUMENTS

| | | | | |
|---|---|---|---|---|
| 4,100,532 A | | 7/1978 | Farnbach | 340/146.3 |
| 4,348,736 A | * | 9/1982 | Weinberger | 708/710 |
| 5,302,865 A | * | 4/1994 | Steele et al. | 326/40 |
| 5,586,288 A | * | 12/1996 | Dahlberg | 711/108 |
| 5,742,224 A | * | 4/1998 | Gadducci et al. | 340/146.2 |
| 6,191,683 B1 | * | 2/2001 | Nygaard, Jr. | 340/146.2 |
| 6,353,646 B1 | * | 3/2002 | Rossignol | 375/375 |

* cited by examiner

Primary Examiner—David H. Malzahn

(57) ABSTRACT

A system and method are provided to evaluate logical values from target systems. The system includes a configuration in a field programmable gate array for performing a doubly bounded comparison. The configuration advantageously allows the user to determine when values are greater than or less than a predefined value while employing a reduced number of lookup tables in the field programmable gate array. The configuration includes an input to receive a parallel logical value. The system also includes a number of equality lookup tables configured to detect an equality between a portion of the logical value and a portion of a predefined value. The system also includes a number of inequality lookup tables configured to determine a type of an inequality between the portion of the logical value and the portion of the predefined value. The predefined value is preprogrammed and downloaded to the equality lookup tables at startup. The inequality lookup tables each include an output that is applied to an OR function, thereby producing an output.

12 Claims, 6 Drawing Sheets

SYSTEM AND METHOD FOR COMPARING VALUES FROM TARGET SYSTEMS

TECHNICAL FIELD

The present invention is generally related to the fields of computers and digital analysis and, more particularly, is related to a system and method for comparing values from a target system during logic analysis.

BACKGROUND OF THE INVENTION

Current manufacturers of high-speed computer equipment often need to access data information that is communicated on a data bus or other conductors within the equipment for testing or other reasons. Conventional approaches to accessing data on a bus include the use of logic analyzers that provide probes that are placed in electrical contact with the particular conductors in question.

In a typical arrangement, the probes are positioned to obtain the data signals from the target system and the target system is operated to produce the desired data values that are captured by the probes. These data values are acquired and stored in a memory in the logic analyzer. However, many of the target systems that are analyzed using logic analyzers operate at speeds measured in hundreds of megahertz. Consequently, the data values obtained from such a target system will quickly fill up the memory of the logic analyzer. In many cases, this occurs within a few milliseconds.

As a result, logic analyzers have employed circuitry to perform a quick comparison between the values obtained from the target system and desired values specified by the user to detect specific data values from the target system. Generally, only those data values from the target system are stored in the memory of the logic analyzer. In this manner, a reduced number of data values are then stored in the memory of the logic analyzer, thus preventing the memory from becoming full prematurely.

The approaches employed to perform this comparison typically employ logic circuits and other devices of significant size and complexity. Accordingly, such circuits are costly and the number of desired values that may be employed by a single logic analyzer are limited.

SUMMARY OF THE INVENTION

In light of the foregoing, the present invention provides for a system and method to compare logical values from target systems. According to one embodiment, the system includes a configuration in a field programmable gate array for comparing logical values. The configuration advantageously facilitates determining when values are greater than or less than a predefined value while employing a reduced number of lookup tables in the field programmable gate array. The configuration includes an input interface to receive a parallel logical value. The system also includes a number of equality lookup tables configured to detect an equality between a portion of the logical value and a portion of a predefined value. The system also includes a number of inequality lookup tables configured to determine a type of an inequality between the portion of the logical value and the portion of the predefined value. The predefined value is preprogrammed and downloaded to the equality lookup tables at startup. The inequality lookup tables each include an output that is applied to an OR function, thereby producing an output.

Another embodiment of the present invention includes a method in a field programmable gate array for comparing logical values. Broadly stated, the method includes the steps of receiving a logical value, detecting an equality between a portion of the logical value and a portion of a predefined value, and determining a type of an inequality between the portion of the logical value and the portion of the predefined value.

The various embodiments of the present invention provide a significant advantage in that a single FPGA may be employed to perform a greater number of comparisons than prior art configurations. Thus, a logic analyzer that employs the present invention has much greater capacity to evaluate specific logical values based on predetermined criterion at lower cost.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
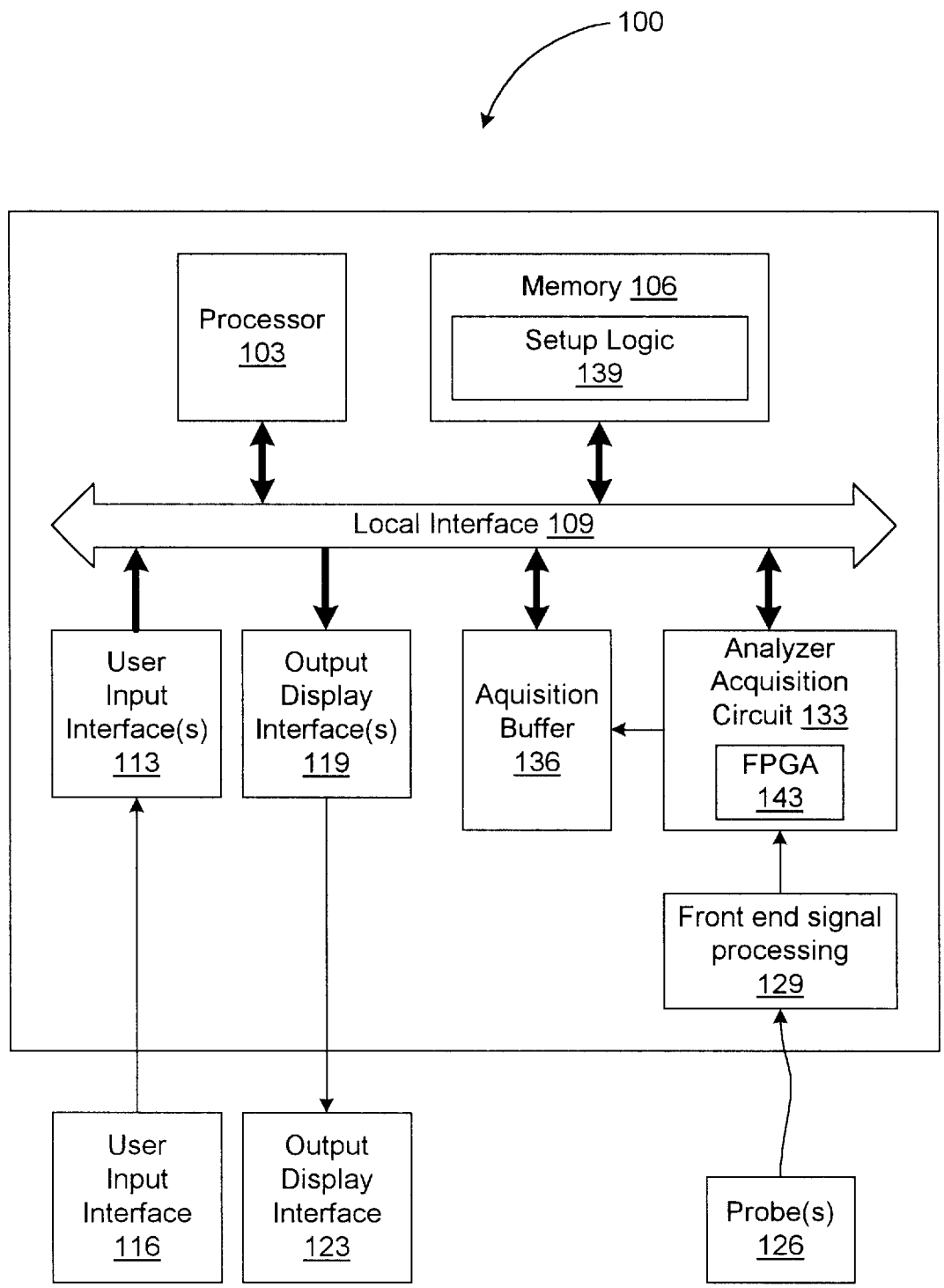
FIG. 1 is a block diagram of a logic analyzer according to an embodiment of the present invention.

Turning to FIG. 1, shown is logic analyzer 100 according to an embodiment of the present invention. The logic analyzer 100 includes a processor circuit that includes a processor 103 and a memory 106. The processor 103 and memory 106 are both coupled to a local interface 109. The local interface 109 may comprise, for example, a data bus and a control bus. The memory 106 includes volatile and/or nonvolatile memory components such as random access memory (RAM), read only memory (ROM), hard drive(s), compact disk drive(s) with accompanying compact disks, tape drives with accompanying magnetic tape, floppy disk drives with accompanying floppy disk(s), or other such devices. "Volatile" memory refers to that memory that is lost upon a loss of power, whereas "nonvolatile" refers to memory that maintains data values despite a loss of power.

The logic analyzer 100 further comprises an input interface 113 that makes data generated by a user interface 116 available on the local interface 109 to be manipulated by the processor 103, etc. The user interface 116 may include, for example, a keypad, keyboard, or other appropriate input device. The logic analyzer 100 also includes at least one output interface 119 through which data is applied from the local interface 109 to one or more output displays 123. The output displays may include, for example, a cathode ray tube, liquid crystal display, or other suitable display device.

In addition, the logic analyzer 100 features one or more probes 126 that are coupled to front end processing circuits 129 such as voltage comparators, level shifters, impedance matchers, equalizers, etc. During use of the logic analyzer 100, the probes 126 are coupled to a target system (not shown) to obtain the logical signals therefrom. The logical signals are generally digital signals as known in the art. The logical signals are processed by the front-end signal processing circuits 129 to ascertain logical values therefrom. The front end processing circuits 129 are generally understood by those skilled in the art and are not discussed in detail herein. The logical values are then applied to the analyzer acquisition circuit 133. An acquisition buffer 136 is coupled to the analyzer acquisition circuit 133 that is used to store information from the target system as triggered by the analyzer circuit 133.

During operation of the logic analyzer 100, the analyzer acquisition circuit 133 performs a comparison function that detects the occurrence of desired logical values among the logical values obtained from the target system. The analyzer acquisition circuit 133 also acts as an acquisition buffer control that controls the storage of the information in the acquisition buffer and performs a trigger control function that indicates when storage into the acquisition buffer 136 should terminate.

Stored on the memory 106 is setup logic 139 of the present invention that is executed by the processor 103. The setup logic 136 is executed to configure the analyzer acquisition circuit 133 for detection of specific desired logical values and for performing other functions not discussed in detail herein. To perform these tasks, the analyzer acquisition circuit 133 may include one or more field programmable gate arrays (FPGAs) 143, which are well known in the art. During startup of operation of the logic analyzer 100, one of the tasks performed by the setup logic 139 is to download a configuration string into the FPGA 143. This configuration string causes the FPGA 143 to operate in a predefined manner to evaluate incoming logical values according to predefined criteria as will be discussed in addition to the other functionality mentioned previously. For further discussion relative to a possible example of the logic analyzer 100, reference is made to U.S. patent application entitled "Reconfigurable Digital Instrument Mainframe," that was filed on Apr. 17, 1999 and accorded Ser. No. 09/300,207, and is incorporated herein by reference in its entirety.

Figure 2:
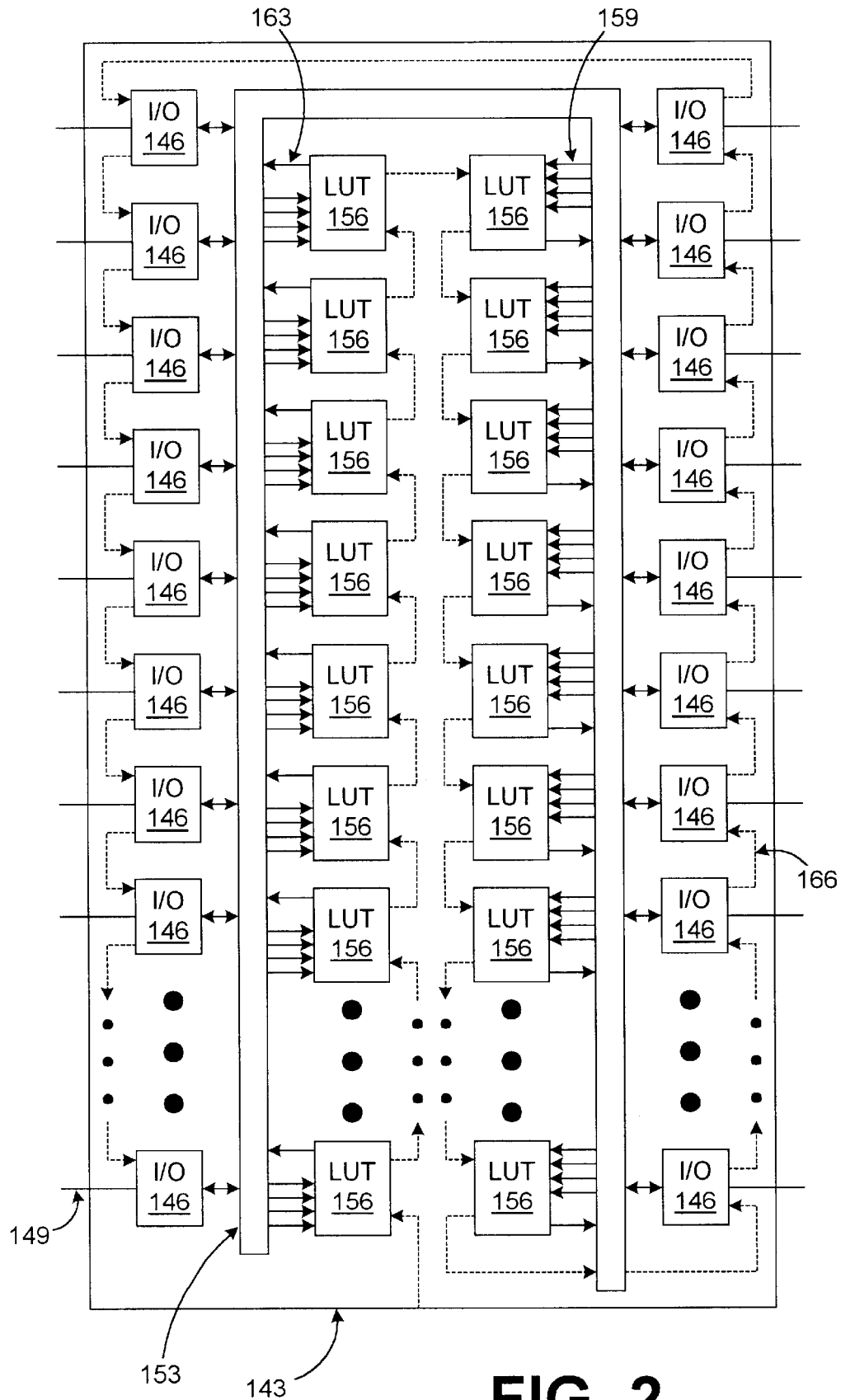
FIG. 2 is a block diagram of a representative field programmable gate array (FPGA) employed in the logic analyzer of FIG. 1.

With reference to FIG. 2, shown is a block diagram of a representative FPGA 143 as employed in the present invention. The FPGA 143 includes a number of input/output circuits 146 that are each electrically coupled to an input/output pin 149. The input/output circuits 146 are configurable to either receive or transmit data values and include, for example, a data buffer and other circuitry as known by those skilled in the art. For example, the input/output circuits 146 may perform various sampling functions and other functionality.

Each of the input/output circuits 146 is electrically coupled to a switching fabric 153. Also coupled to the switching fabric 153 are a number of lookup tables 156. The switching fabric 153 serves to electrically couple the input/output circuits 146 to the lookup tables 156 so the values received by the input/output circuits 146 (for those configured to receive data) are applied to an appropriate lookup table 156 and so that outputs from the lookup tables 156 are applied to those input/output circuits 146 configured to transmit data values. Note that the switching fabric 153 may also link lookup tables 156 to each other in order to perform various tasks.

Each of the lookup tables 156 includes four inputs 159 as shown with a single output 163. Each of the lookup tables 156, input/output circuits 146, and the switching fabric 153 are all linked in a manner so as to form a common configuration shift register 166 as shown. In fact, these components all receive shifted values as well as a shift clock signal that triggers the configuration function. To explain further, the various components in the FPGA 143 may be configured to perform one of a multitude of operations. A particular lookup table 156 or input/output circuit 146, for example, will perform these functions based upon the configuration values applied to the component at start up. These configuration values are applied to all of the components in the form of a single configuration string of bits that are shifted into all of the components as shown. When the first bit in the configuration string reaches the last position in the last component, shown as the input/output circuit 146 in the lower right corner, then each component will have its proper configuration values that control its operation. Thereafter, the FPGA 143 may be employed to perform the specific tasks in the logic analyzer 100 (FIG. 1). Thus, at start up, the configuration string is downloaded or shifted into the FPGA 100 before the acquisition of logical values begins.

Figure 3:
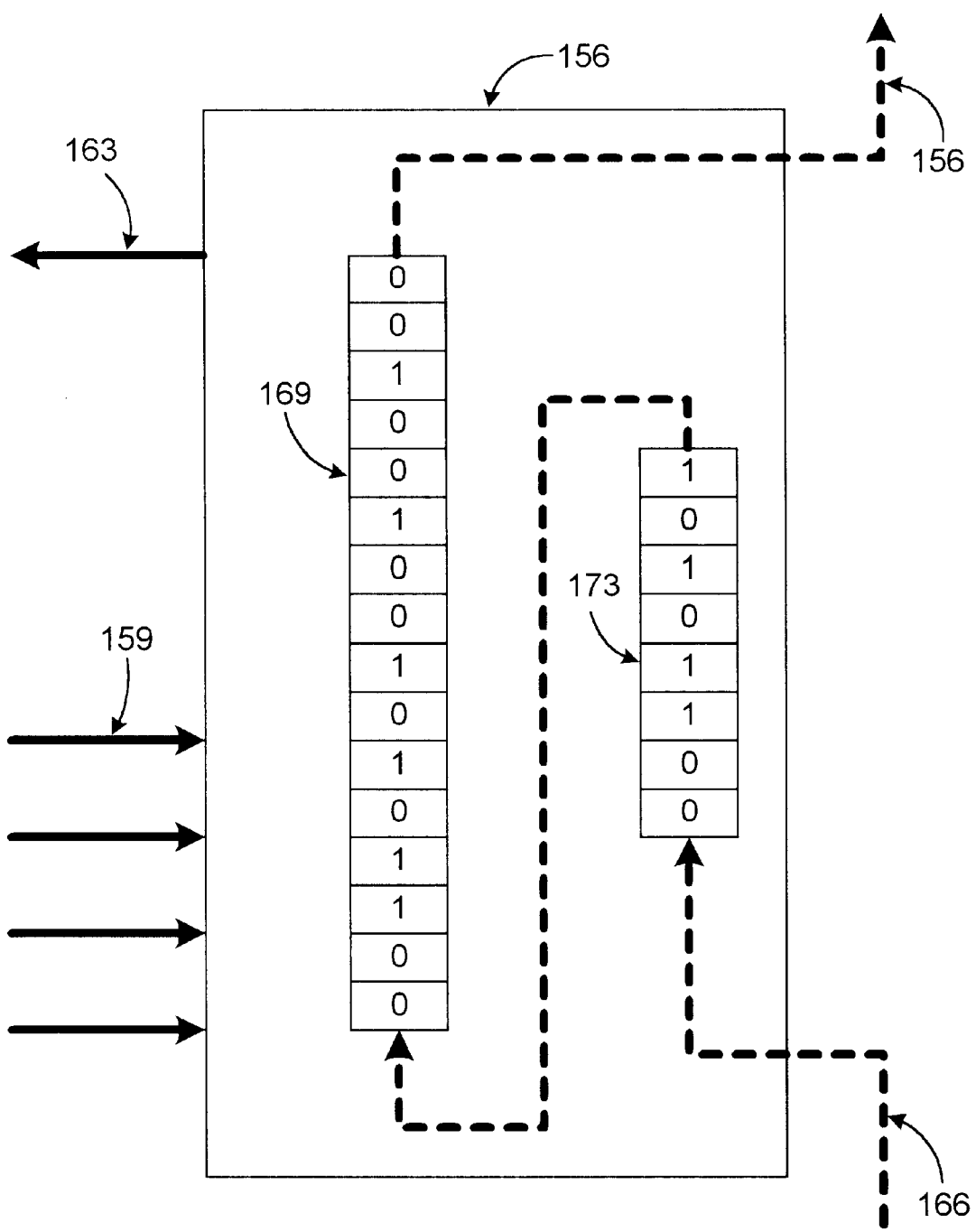
FIG. 3 is a block diagram of a lookup table employed in the field programmable gate array of FIG. 2.

Referring next to FIG. 3, shown is a lookup table 156 as employed in the present invention. The lookup table 156 includes the four inputs 159 and a single output 163. The four inputs 159 are generally selection inputs that point to one of sixteen values held in a 16×1 table 169. The value chosen is then applied to the output 163 in accordance with the operation of the lookup table 156. Although the lookup table 156 is shown here as having four inputs that select one of sixteen outputs, it is understood that the lookup table may have more or less values in the table as well as more or less inputs or outputs. The lookup table 156 also includes one or more configuration registers 173 that hold values that control the operation of the lookup table 156 itself This may include operation of an associated flip-flop, dedicated logic, and/or additional inputs not directly connected to the table 169, etc. Note that the table 169 and the configuration register 173 are part of the common configuration shift register 166 as shown. When the shift clock is activated for the FPGA 143 (FIG. 2), then values are shifted into the configuration register 173 and the table 169 accordingly. Note that the values in the 16×1 table 169 are not necessarily shifted consecutively, where any order of shifting among the various registers may be employed depending upon the physical layout of the lookup table 156 and of the FPGA 143 itself.

Figure 4:
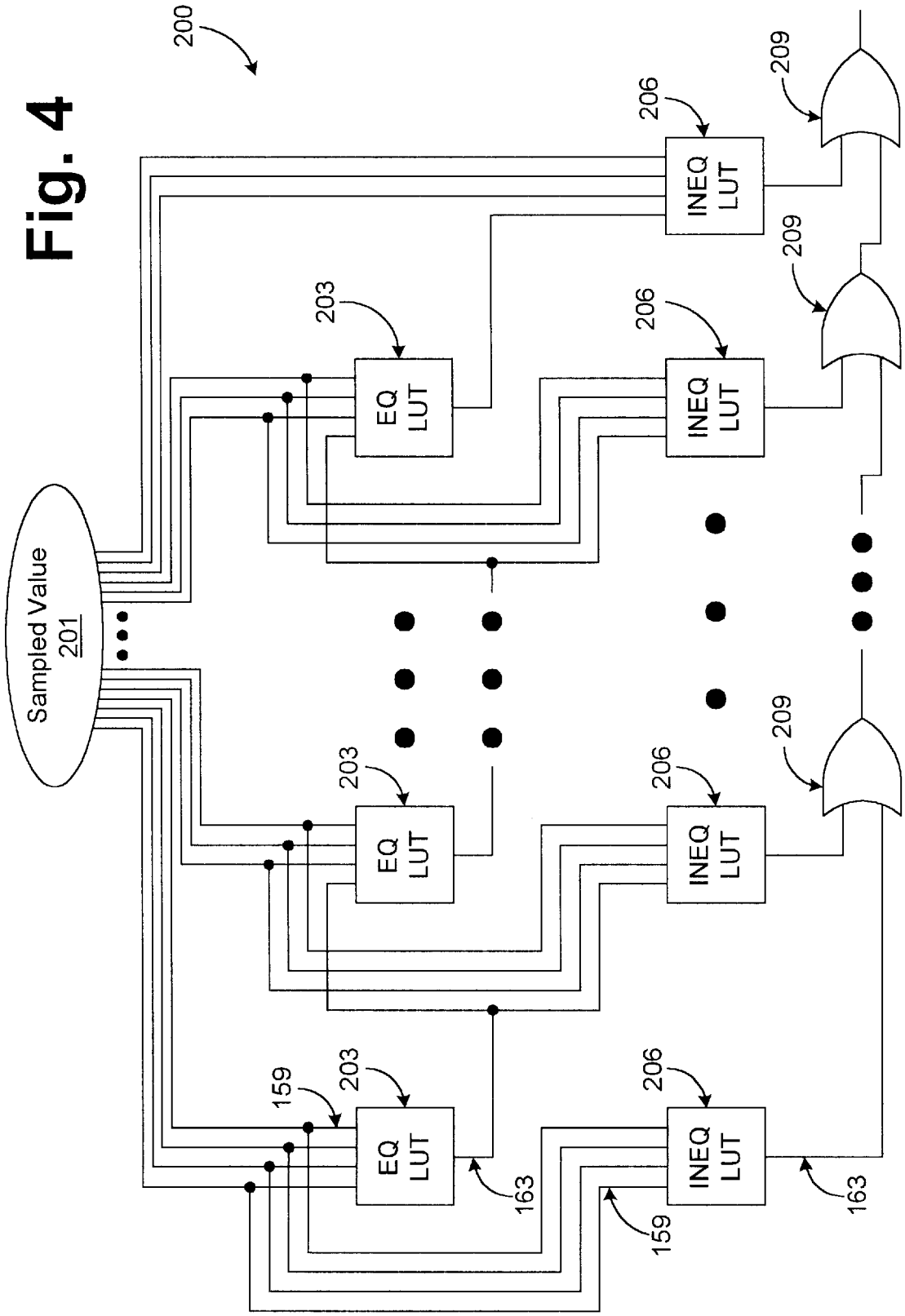
FIG. 4 is a block diagram of a comparison configuration of lookup tables employed in the logical analyzer of FIG. 1.

With reference to FIG. 4, shown is a block diagram of a comparator 200 according to an embodiment of the present invention. The comparator 200 is employed to determine when the sampled value 201 is greater than or equal to a predefined value or when the sampled value 201 is less than or equal to a predefined value. The comparator 200 includes a number of equality lookup tables 203 (hereafter "equality tables") and a number of inequality lookup tables 206 (hereafter "inequality tables").

Applied to the inputs of the equality tables 203 and corresponding inequality tables 206 are Q bit portions of an N bit sampled value and an output of an equality table 203 to the left as shown. This is the case for all of the equality and inequality lookup tables 203 and 206 except for the left most equality and inequality tables 203 and 206. Applied to the inputs of the left most equality and inequality tables 203 are Q+1 bit portions of the N bit sampled value 201. In the configuration of FIG. 4, Q=3, although it would be possible for Q to be greater or less than 3, depending upon the number of inputs for each of the equality and inequality lookup tables 203 and 206.

The outputs of the inequality lookup tables 206 are applied to an OR function. The OR function may be achieved by applying the outputs to a series of cascaded OR gates 209 as shown, or by applying the outputs of all the inequality lookup tables 206 to a single OR gate (not shown) or other configuration to accomplish the OR function. The OR function may also be accomplished using other lookup tables 156 (FIG. 2) in the programmable gate array 143 (FIG. 2). The output of the OR function is the output of the entire comparator 200.

Next the operation of the comparator 200 is described. The operation of the comparator 200 is based upon the concept that an inequality between a sampled logical value and a threshold value can be significant or insignificant. For example, suppose one wishes to detect any value greater than or equal to a threshold value of 100010001000. A logical value of 100010001001 is greater than the threshold, but the value of 100010000111 is less. Both of these logical values have at least 8 bits on the left side that are identical to the corresponding bits of the threshold value. To detect whether a particular value is greater than the threshold then, it is necessary to determine at what order do the numbers differ and what kind of difference it is.

Thus, to determine at what order the two numbers differ, an equality comparison is performed between the various portions of the logical value and the corresponding portions of the threshold value from left to right. The "left" refers to the most significant bits of the logical value, whereas the right refers to the least significant bits of the logical value. If an inequality is detected in a particular portion of a logical value in comparison to the corresponding threshold value, then it is necessary to determine whether the portion of the logical value is greater than the corresponding portion of the threshold value. If an inequality is not detected in a particular portion of a logical value in comparison to the corresponding threshold value, then the comparison moves to the right to compare the next portion of the logical value with the corresponding portion of the threshold value.

The comparator 200 accomplishes the forgoing by first examining whether the most significant bits of the sampled logical value 201 are equal to corresponding most significant bits of a threshold value. The leftmost equality table 203 performs this comparison where the output of the leftmost equality lookup table 203 is a logical "1" if the inputs equal the most significant bits of the threshold value. Thus, the leftmost equality table 203 is programmed so that when its inputs are set equal to the corresponding bits of the threshold value, it generates a logical "1" at its output. For to all other input values, the output of the leftmost equality table 203 is a logical "0".

The remaining equality tables are programmed in a similar manner except that the most significant input bit is received from the equality table to the left as an enabling bit. The remaining inputs are employed to determine an equality. When an inequality is detected in an equality table 203, the corresponding inequality table 206 performs the inequality function between the particular portion of the sampled logical and the corresponding portion of then threshold value. Further equality and inequality comparisons are not performed as equality and inequality tables 203 and 206 to the right are not enabled. The following provides an illustration of the foregoing discussion with reference to a number of lookup tables.

Figure 5:
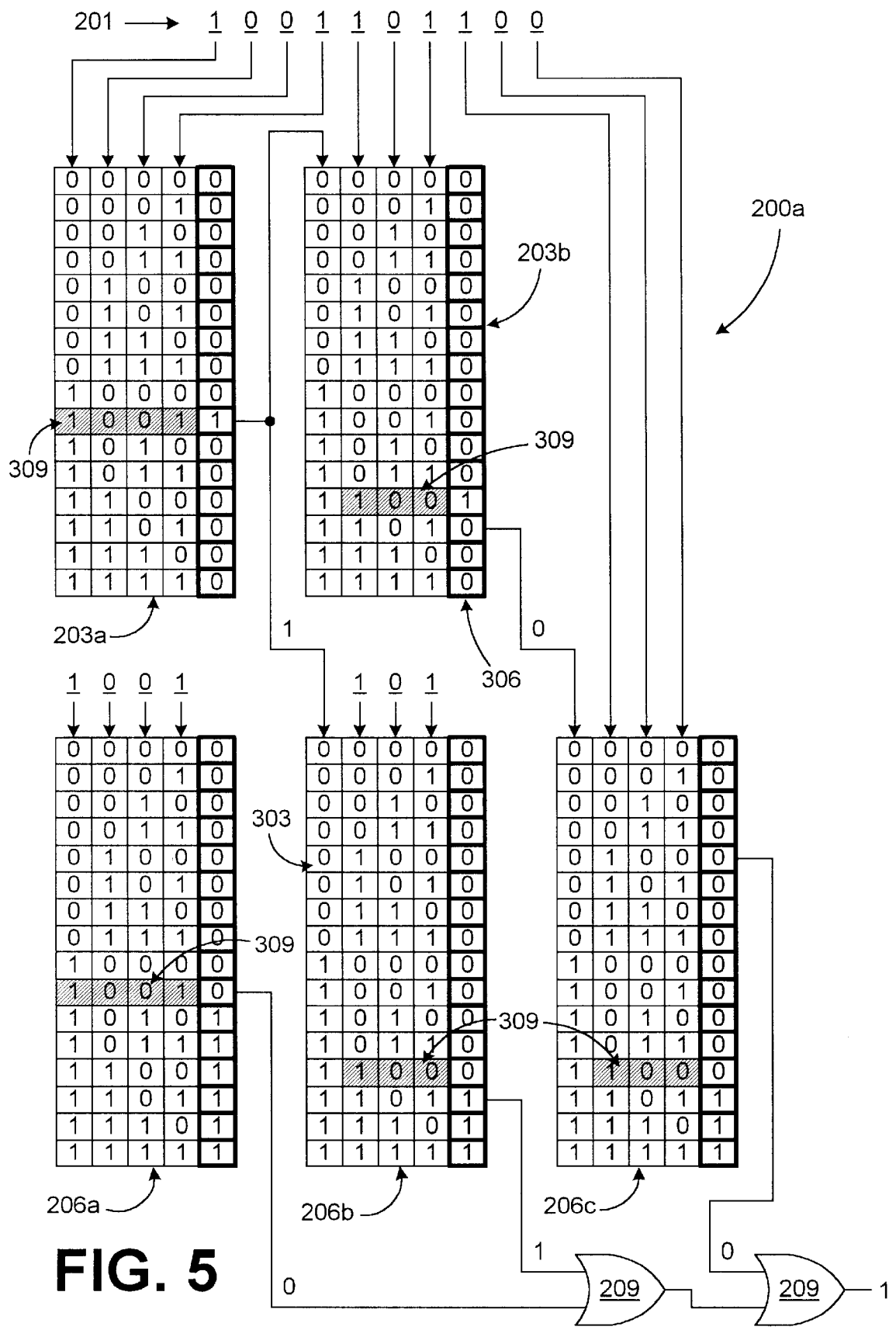
FIG. 5 illustrates charts of examples of lookup tables according to the comparison configuration of FIG. 4.

Turning to FIG. 5, shown is an exemplary comparator 200a that employs two equality tables 203a and 203b and three inequality tables 206a, 206b, and 206c, each table having input columns 303 and a single output column 306. The tables 203a–b and 206a–c are linked as discussed with reference to FIG. 4. The configuration shown is employed to detect logical values greater than or equal to a threshold value 309 of 101100100. The threshold value is held by the equality/inequality tables 203a, 203b, and 206c for comparison as indicated by shaded sections.

The sampled logical value 201 of 1001101100 is applied to the comparator 200a as shown. The most significant four digits "1001" are applied to the inputs of the leftmost equality table 203a that produces an output of a logical "1" as shown. The inequality table 206a produces a logical "0" since the same input was not greater or equal to "1001".

The next three digits "101" and the output of logical "1" from equality table 203a are applied to the inputs of both equality table 203b and the inequality table 206b as shown. The output of equality table 203b is equal to a logical "0" since the three digits "101" are not equal to the corresponding threshold digits "100". Thus, the determination as to the type of inequality that exists is performed by the inequality table 206b.

Given that the output from the equality table 203a is a logical "1", the inputs of "101" applied to the inequality table 206b result in an output of a logical "1" as shown. This is because "101" is greater than "100". The output from the inequality table 206c is a logical "0". The logical "1" output by the inequality table 206b causes an output of logical "1" since 1001101100 is greater than the threshold of 1001100100.

Note that the above comparison involves the detection of values that are greater than the threshold value 309. The same approach applies to different criteria such as "greater than or equal to", "less than", or "less than or equal to", etc. Also, one may employ two comparators 200 to achieve a doubly bounded range detector that detects when a value is greater than a lower threshold and less than a higher threshold, etc.

In addition, the lookup tables of the comparator 200 may also be configured to mask out bits that are irrelevant to the comparison being performed. Such bits are called "don't care" bits. In order to accommodate "don't care" bits, the values placed in the 16×1 tables 169 (FIG. 3) of the equality and inequality lookup tables 203 and 206 should be set accordingly. For example, suppose that the most significant bit of the equality lookup table 203a of FIG. 5 is a "don't care" bit. If such were the case, then the output would be a logical "1" for two values, namely, "0001", and "1001" since the most significant bit is not taken into account. Likewise, the outputs of the inequality lookup table 206a would be a logical "1" for input values of "0010-0111" and "1010-1111" accordingly. Any one of the input bits of the sampled logical value 201 may be a "don't care" bit, depending upon the particular application. Consequently, the outputs of the equality and inequality lookup tables 203 and 206 should be set accordingly to reflect any "don't care" bits keeping the above concepts in mind.

Figure 6:
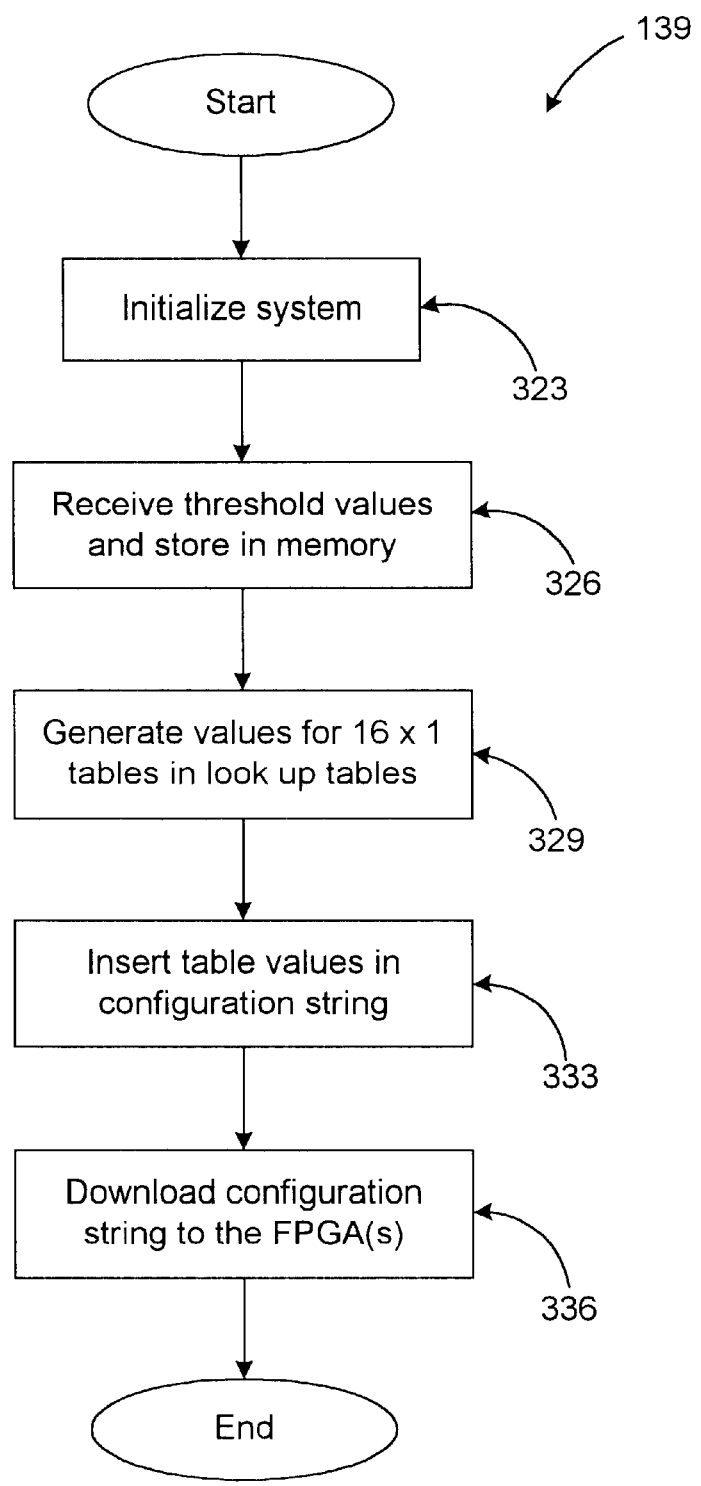
FIG. 6 is a flow chart of setup logic executed in the logic analyzer of FIG. 1.

With reference then, to FIG. 6, shown is the setup logic 139 that is executed by the processor 103 (FIG. 1). Beginning at block 323, the system is initialized for operation. Thereafter, in block 326 the threshold values 309 (FIG. 5) are received via the user input interface 116 and stored in the memory 106. Next, in block 329, the values to be placed in the 16×1 tables 169 (FIG. 3) are generated from the threshold values 309. In block 333 the values to be placed in the 16×1 tables 169 are inserted into the configuration string to be downloaded to the FPGA 143 (FIG. 2). This may be accomplished by tools specific to the FPGA 143 or by algorithms relative to the structure of the configuration string that is used with a specific FPGA 143. Finally, in block 336, the configuration string is downloaded into the FPGA 143 and the logic analyzer 100 (FIG. 1) is ready for data acquisition from the target system.

Turning back to FIG. 6, the setup logic 139 of the present invention can be implemented in hardware, software, firmware, or a combination thereof In the preferred embodiment(s), the setup logic 139 is implemented in software or firmware that is stored in a memory and that is executed by a suitable instruction execution system. If implemented in hardware, as in an alternative embodiment, the setup logic 139 can be implemented with any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Also, the flow chart of FIG. 6 shows the architecture, functionality, and operation of a possible implementation of the setup logic 139. In this regard, each block represents a module, segment, or portion of code, which comprises one or more executable instructions for implementing the specified logical function(s). It should also be noted that in some alternative implementations, the functions noted in the blocks may occur out of the order noted in FIG. 6. For example, two blocks shown in succession in FIG. 6 may in fact be executed substantially concurrently or the blocks may sometimes be executed in the reverse order, depending upon the functionality involved.

Finally, the setup logic 139, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Many variations and modifications may be made to the above-described embodiment(s) of the invention without departing substantially from the spirit and principles of the invention. All such modifications and variations are intended to be included herein within the scope of the present invention.

What is claimed is:

1. A configuration in a field programmable gate array for comparing logical values, comprising:

an input interface to receive a logical value;

a number of equality lookup tables configured to detect an equality between a portion of the logical value and a portion of a predefined value; and a number of inequality lookup tables configured to determine a type of an inequality between the portion of the logical value and the portion of the predefined value.

2. The configuration of claim 1, wherein the type of inequality is greater than.

3. The configuration of claim 1, wherein the type of inequality is less than.

4. The configuration of claim 1, wherein the equality lookup tables are enabled to detect the equality of the portion of the logical value and the portion of the predefined value from left to right.

5. The configuration of claim 1, wherein an output of each of the equality lookup tables enables a detection of a type of inequality in one of the inequality lookup tables.

6. The configuration of claim 1, wherein:

the equality lookup tables further comprise a left most equality lookup table and a number of remaining equality lookup tables;

the left most equality lookup table always being-enabled to detect an equality; and the remaining equality lookup tables being enabled to detect the inequality from the equality lookup table to the left.

7. A configuration in a field programmable gate array for comparing a logical value against a predefined value comprising:

means for receiving the logical value means programmed with the predefined value for detecting an equality between portion of the logical value and a portion of the predefined value; and means for determining a type of an inequality between the portion of the logical value and the portion of the predefined value.

8. The configuration of claim 7, wherein the means for determining a type of an inequality further comprises means for detecting when the portion of the logical value is greater than the portion of the predefined value.

9. The configuration of claim 7, wherein the means for determining a type of an inequality further comprises means for detecting when the portion of the logical value is less than the portion of the predefined value.

10. A method in a field programmable gate array for comparing logical values, comprising the steps of:

configuring the field programmable gate array with one or more look up tables having a predefined threshold value, receiving a logical value;

detecting an equality between a portion of the logical value and a portion of the predefined threshold value; and determining a type of an inequality between the portion of the logical value and the portion of the predefined threshold_value when the equality is not detected.

11. The method of claim 10, wherein the step of determining a type of an inequality further comprises the step of detecting when the portion of the logical value is greater than the portion of the predefined value.

12. The method of claim 10, wherein the step of determining a type of an inequality further comprises the step of detecting when the portion of the logical value is less than the portion of the predefined value.

* * * * *